(12) United States Patent
Luo et al.

(10) Patent No.: US 10,930,534 B2
(45) Date of Patent: Feb. 23, 2021

(54) METHOD AND DEVICE FOR MANUFACTURING A DISPLAY APPARATUS, AND COMPUTER-READABLE STORAGE MEDIUM

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Qingping Luo, Beijing (CN); Min Quan, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 78 days.

(21) Appl. No.: 16/217,414

(22) Filed: Dec. 12, 2018

(65) Prior Publication Data

US 2019/0228998 A1 Jul. 25, 2019

(30) Foreign Application Priority Data

Jan. 22, 2018 (CN) .......................... 201810058310.7

(51) Int. Cl.
*G06T 7/00* (2017.01)
*H01L 21/67* (2006.01)
(Continued)

(52) U.S. Cl.
CPC .......... *H01L 21/67288* (2013.01); *G06K 9/62* (2013.01); *G06T 7/0004* (2013.01); *H01L 22/20* (2013.01); *G06T 2207/30121* (2013.01)

(58) Field of Classification Search
CPC ..... H01L 21/67288; H01L 22/20; G06K 9/62; G06T 7/004; G06T 2207/30121
See application file for complete search history.

(56) References Cited

U.S. PATENT DOCUMENTS

| 10,180,589 B2 | 1/2019 | Chien |
| 10,268,082 B2 | 4/2019 | Yu |
| 2015/0192826 A1* | 7/2015 | Lin .................. G02F 1/133514 359/891 |

FOREIGN PATENT DOCUMENTS

| CN | 102004350 A | 4/2011 |
| CN | 105445986 A | 3/2016 |

(Continued)

OTHER PUBLICATIONS

Wang et al., "An optimal yield mapping approach for the small and medium sized liquid crystal displays", Mar. 2, 2005, Int J Adv Manuf Technolo (Year: 2005).*

(Continued)

*Primary Examiner* — Thomas C Lee
*Assistant Examiner* — Gary Collins
(74) *Attorney, Agent, or Firm* — Nath, Goldberg & Meyer; Joshua B. Goldberg

(57) ABSTRACT

The present disclosure provides a method and device for manufacturing a display apparatus, and a computer-readable storage medium. The method includes: receiving a first substrate motherboard set placed in a first clamping structure; determining, in a collection comprising a plurality of second substrate motherboard sets placed in a plurality of second clamping structures in a waiting pool, whether there exists a combination of second substrate motherboard sets which is best matched with the received first substrate motherboard set; determining, in a case that there exists the combination of second substrate motherboard sets which is best matched with the received first substrate motherboard (Continued)

set, the combination of second substrate motherboard sets which is best matched with the received first substrate motherboard set, and assembling the determined combination of second substrate motherboard sets which is best matched with the received first substrate motherboard set with the received first substrate motherboard set.

15 Claims, 6 Drawing Sheets

(51) Int. Cl.
      *H01L 21/66*     (2006.01)
      *G06K 9/62*     (2006.01)

(56) References Cited

FOREIGN PATENT DOCUMENTS

| CN | 106646957 A | 5/2017 |
|----|-------------|--------|
| WO | 2014147992 A1 | 9/2014 |

OTHER PUBLICATIONS

Office Action dated Nov. 29, 2019 issued in corresponding Chinese Application No. 201810058310.7.

* cited by examiner

METHOD AND DEVICE FOR MANUFACTURING A DISPLAY APPARATUS, AND COMPUTER-READABLE STORAGE MEDIUM

CROSS-REFERENCE TO RELATED APPLICATION

The present disclosure claims priority of the Chinese patent application No. 201810058310.7 filed on Jan. 22, 2018, the entire contents of which are incorporated herein by reference.

TECHNICAL FIELD

The present disclosure relates to the field of display apparatuses, and in particular, to a method and device for manufacturing a display apparatus, and a computer-readable storage medium.

BACKGROUND

In the process of manufacturing a display panel, in order to correctly assembling an array substrate with a color film substrate, it is necessary to match the array substrate with the color film substrate before the array substrate and the color film substrate are assembled.

SUMMARY

The present disclosure provides a method for manufacturing a display apparatus, including:

receiving a first substrate motherboard set placed in a first clamping structure;

determining, in a collection including a plurality of second substrate motherboard sets placed in a plurality of second clamping structures in a waiting pool, whether there exists a combination of second substrate motherboard sets which is matched with the received first substrate motherboard set;

determining, in a case that there exists the combination of second substrate motherboard sets which is matched with the received first substrate motherboard set, a combination of second substrate motherboard sets which is best matched with the received first substrate motherboard set, and assembling the determined combination of second substrate motherboard sets which is best matched with the received first substrate motherboard set with the received first substrate motherboard set to form the display apparatus, the first substrate motherboard set includes a plurality of first substrate motherboards and the second substrate motherboard set includes a plurality of second substrate motherboards;

the step of determining, in the collection comprising the plurality of second substrate motherboard sets placed in the plurality of second clamping structures in the waiting pool, whether there exists the combination of second substrate motherboard sets which is best matched with the received first substrate motherboard set includes: forming different combinations of second substrate motherboard sets from the plurality of second substrate motherboard sets in the waiting pool by using Cartesian product, calculating a first matching rate between each combination of second substrate motherboard sets and the received first substrate motherboard set according to panel quality parameters of second substrates of the combination of second substrate motherboard sets and panel quality parameters of first substrates of the received first substrate motherboard set, and determining, in all calculated first matching rates for the different combinations of second substrate motherboard sets, whether there exists a first matching rate greater than or equal to a predetermined initial threshold of the first matching rate to obtain a determination result, and if the determination result is positive, determining that there exists the combination of second substrate motherboard sets which is matched with the received first substrate motherboard set;

the step of the determining the combination of second substrate motherboard sets which is best matched with the received first substrate motherboard set includes: determining the first matching rate and a second matching rate between each combination of second substrate motherboard sets and the received first substrate motherboard set according to panel quality parameters of second substrates of the combination of second substrate motherboard sets and panel quality parameters of first substrates of the received first substrate motherboard set, and determining the combination of second substrate motherboard sets which is best matched with the received first substrate motherboard set according to all the determined first matching rates and second matching rates.

In some embodiments, the step of determining the first matching rate and the second matching rate between each combination of second substrate motherboard sets and the received first substrate motherboard set according to panel quality parameters of second substrates of the combination of second substrate motherboard sets and panel quality parameters of first substrates of the received first substrate motherboard set, and determining the combination of second substrate motherboard sets which is best matched with the received first substrate motherboard set according to all the determined first matching rates and second matching rates includes:

setting an initial threshold of the second matching rate;

calculating, according to panel quality parameters of second substrates of a combination of second substrate motherboard sets and panel quality parameters of first substrates of the received first substrate motherboard set, the first matching rate and the second matching rate between the combination of second substrate motherboard sets and the received first substrate motherboard set in a predetermined order;

updating, in a case that the calculated first matching rate is greater than the current threshold of the first matching rate, the threshold of the first matching rate to the calculated first matching rate and updating the combination of second substrate motherboard sets which is best matched with the received first substrate motherboard set to the combination of second substrate motherboard sets; and updating, in a case that the calculated first matching rate is equal to the current threshold of the first matching rate and the calculated second matching rate is greater than the current threshold of the second matching rate, the threshold of the second matching rate to the calculated second matching rate and updating the combination of second substrate motherboard sets which is best matched with the received first substrate motherboard set to the combination of second substrate motherboard sets.

In some embodiments, the combination of second substrate motherboard sets satisfies conditions that the number of the second substrate motherboards of the combination of second substrate motherboard sets is equal to the number of the first substrate motherboards of the received first substrate motherboard set, and the number of defective second substrates of the combination of second substrate motherboard sets is greater than or equal to the number of defective first substrates of the received first substrate motherboard set; and one first substrate motherboard includes a plurality of first substrates and one second substrate motherboard includes a plurality of second substrates.

In some embodiments, the first matching rate between the combination of second substrate motherboard sets and the received first substrate motherboard set is calculated by using the following Equation $$P = 1 - \frac{C_N * A_0}{n_1} 100\%,$$

the second matching rate between the combination of second substrate motherboard sets and the received first substrate motherboard set is calculated by using the following Equation $$Q = \frac{C_N * A_N + C_0 * A_0}{n_1} 100\%,$$

and

P is the first matching rate, Q is the second matching rate, $n_1$ is the number of the first substrates of the received first substrate motherboard set, $C_N$ is the number of the defective first substrates of the received first substrate motherboard set, $C_0$ is the number of non-defective first substrates of the received first substrate motherboard set, $A_N$ is the number of the defective second substrates of the combination of second substrate motherboard sets, $A_0$ is the number of non-defective second substrates of the combination of second substrate motherboard sets.

In some embodiments, in a case that there does not exist the combination of second substrate motherboard sets which is best matched with the received first substrate motherboard set, the method further includes:

determining whether there exists at least one non-defective first substrate motherboard in the received first substrate motherboard set;

determining, in a case that there exists at least one non-defective first substrate motherboard in the received first substrate motherboard set, the at least one non-defective first substrate motherboard, and assembling the determined at least one non-defective first substrate motherboard with a same number of non-defective second substrate motherboards to form the display apparatus; and dividing, in a case that there does not exist a non-defective first substrate motherboard in the received first substrate motherboard set, the first substrate motherboards in the received first substrate motherboard set into groups according to the number of the defective first substrates in the first substrate motherboard to obtain divided first substrate motherboards to be matched with each combination of second substrate motherboard sets again.

In some embodiments, the received first substrate motherboard is a color film substrate motherboard and the second substrate motherboard is an array substrate motherboard.

In some embodiments, the step of assembling the determined combination of second substrate motherboard sets which is best matched with the received first substrate motherboard set with the received first substrate motherboard set includes: adjusting an order of the plurality of second substrates of the determined combination of second substrate motherboard sets which is best matched with the received first substrate motherboard set as corresponding to an order of the plurality of first substrates of the received first substrate motherboard set to complete the assembling.

In some embodiments, the initial threshold of the first matching rate is 0 and the initial threshold of the second matching rate is 0.

The present disclosure also provides a device for manufacturing a display apparatus, including:

a receiving portion configured to receive a first substrate motherboard set placed in a first clamping structure;

a first determining portion configured to determine, in a collection including a plurality of second substrate motherboard sets placed in a plurality of second clamping structures in a waiting pool, whether there exists a combination of second substrate motherboard sets which is matched with the received first substrate motherboard set and determine, in a case that there exists the combination of second substrate motherboard sets which is matched with the received first substrate motherboard set, a combination of second substrate motherboard sets which is best matched with the received first substrate motherboard set; and a first performing portion configured to assemble the determined combination of second substrate motherboard sets which is best matched with the received first substrate motherboard set with the received first substrate motherboard set to form the display apparatus, the first substrate motherboard set includes a plurality of first substrate motherboards and the second substrate motherboard set includes a plurality of second substrate motherboards;

the first determining portion is further configured to determine, in the collection comprising the plurality of second substrate motherboard sets placed in the plurality of second clamping structures in the waiting pool, whether there exists the combination of second substrate motherboard sets which is best matched with the received first substrate motherboard set by: forming different combinations of second substrate motherboard sets from the plurality of second substrate motherboard sets in the waiting pool by using Cartesian product, calculating a first matching rate between each combination of second substrate motherboard sets and the received first substrate motherboard set according to panel quality parameters of second substrates of the combination of second substrate motherboard sets and panel quality parameters of first substrates of the received first substrate motherboard set, and determining, in all calculated first matching rates for the different combinations of second substrate motherboard sets, whether there exists a first matching rate greater than or equal to a predetermined initial threshold of the first matching rate to obtain a determination result, and if the determination result is positive, determining that there exists the combination of second substrate motherboard sets which is best matched with the received first substrate motherboard set;

the first performing portion is further configured to determine the combination of second substrate motherboard sets which is best matched with the received first substrate motherboard set by: determining the first matching rate and a second matching rate between each combination of second substrate motherboard sets and the received first substrate motherboard set according to panel quality parameters of second substrates of the combination of second substrate motherboard sets and panel quality parameters of first substrates of the received first substrate motherboard set, and determining the combination of second substrate motherboard sets which is best matched with the received first substrate motherboard set according to all determined first matching rates and second matching rates.

In some embodiments, the step of determining the first matching rate and a second matching rate between each combination of second substrate motherboard sets and the received first substrate motherboard set according to panel quality parameters of second substrates of the combination of second substrate motherboard sets and panel quality parameters of first substrates of the received first substrate motherboard set, and determining the combination of second substrate motherboard sets which is best matched with the received first substrate motherboard set according to all the determined first matching rates and second matching rates includes:

setting an initial threshold of the second matching rate;

calculating, according to panel quality parameters of second substrates of a combination of second substrate motherboard sets and panel quality parameters of first substrates of the received first substrate motherboard set, the first matching rate and the second matching rate between the combination of second substrate motherboard sets and the received first substrate motherboard set in a predetermined order;

updating, in a case that the calculated first matching rate is greater than the current threshold of the first matching rate, the threshold of the first matching rate to the calculated first matching rate and updating the combination of second substrate motherboard sets which is best matched with the received first substrate motherboard set to the combination of second substrate motherboard sets; and updating, in a case that the calculated first matching rate is equal to the current threshold of the first matching rate and the calculated second matching rate is greater than the current threshold of the second matching rate, the threshold of the second matching rate to the calculated second matching rate and updating the combination of second substrate motherboard sets which is best matched with the received first substrate motherboard set to the combination of second substrate motherboard sets.

In some embodiments, the combination of second substrate motherboard sets satisfies conditions that the number of the second substrate motherboards of the combination of second substrate motherboard sets is equal to the number of the first substrate motherboards of the received first substrate motherboard set, and the number of defective second substrates of the combination of second substrate motherboard sets is greater than or equal to the number of defective first substrates of the received first substrate motherboard set; and one first substrate motherboard includes a plurality of first substrates and one second substrate motherboard includes a plurality of second substrates.

In some embodiments, the first matching rate between the combination of second substrate motherboard sets and the received first substrate motherboard set is calculated by using the following Equation $$P = 1 - \frac{C_N * A_0}{n_1} 100\%,$$

the second matching rate between the combination of second substrate motherboard sets and the received first substrate motherboard set is calculated by using the following Equation $$Q = \frac{C_N * A_N + C_0 * A_0}{n_1} 100\%,$$

and

P is the first matching rate, Q is the second matching rate, $n_1$ is the number of the first substrates of the received first substrate motherboard set, C is the number of the defective first substrates of the received first substrate motherboard set, $C_0$ is 0 the number of non-defective first substrates of the received first substrate motherboard set, $A_N$ is the number of the defective second substrates of the combination of second substrate motherboard sets, $A_0$ is the number of non-defective second substrates of the combination of second substrate motherboard sets.

In some embodiments, the device further including:

a second determining portion configured to determine, in a case that there does not exist the combination of second substrate motherboard sets which is best matched with the received first substrate motherboard set, whether there exists at least one non-defective first substrate motherboard in the received first substrate motherboard set; and a second performing portion configured to determine, in a case that there exists at least one non-defective first substrate motherboard in the received first substrate motherboard set, the at least one non-defective first substrate motherboard and assemble the determined at least one non-defective first substrate motherboard with a same number of non-defective second substrate motherboards to form the display apparatus, and divide, in a case that there does not exist a non-defective first substrate motherboard in the received first substrate motherboard set, the first substrate motherboards in the received first substrate motherboard set into groups according to the number of the defective first substrates in a first substrate motherboard to obtain divided first substrate motherboards to be matched with each combination of second substrate motherboard sets again.

In some embodiments, the first substrate motherboard is a color film substrate motherboard and the second substrate motherboard is an array substrate motherboard.

The present disclosure also provides a computer-readable storage medium having stored thereon instructions, when executed by a processor, causing the processor to perform a method for manufacturing a display apparatus including:

receiving a first substrate motherboard set placed in a first clamping structure;

determining, in a collection including a plurality of second substrate motherboard sets placed in a plurality of second clamping structures in a waiting pool, whether there exists a combination of second substrate motherboard sets which is matched with the received first substrate motherboard set;

determining, in a case that there exists the combination of second substrate motherboard sets which is matched with the received first substrate motherboard set, the combination of second substrate motherboard sets which is best matched with the received first substrate motherboard set, and assembling the determined combination of second substrate motherboard sets which is best matched with the received first substrate motherboard set with the received first substrate motherboard set to form the display apparatus, wherein the first substrate motherboard set includes a plurality of first substrate motherboards and the second substrate motherboard set includes a plurality of second substrate motherboards;

the step of determining, in the collection comprising the plurality of second substrate motherboard sets placed in the plurality of second clamping structures in the waiting pool, whether there exists the a combination of second substrate motherboard sets which is matched with the received first substrate motherboard set includes: forming different combinations of second substrate motherboard sets from the plurality of second substrate motherboard sets in the waiting pool by using Cartesian product, calculating a first matching rate between each combination of second substrate motherboard sets and the received first substrate motherboard set according to panel quality parameters of second substrates of the combination of second substrate motherboard sets and panel quality parameters of first substrates of the received first substrate motherboard set, and determining, in all calculated first matching rates for the different combinations of second substrate motherboard sets, whether there exists a first matching rate greater than or equal to a predetermined initial threshold of the first matching rate to obtain a determination result, and if the determination result is positive, determining that there exists the combination of second substrate motherboard sets which is best matched with the received first substrate motherboard set;

the step of the determining the combination of second substrate motherboard sets which is best matched with the received first substrate motherboard set includes: determining the first matching rate and a second matching rate between each combination of second substrate motherboard sets and the received first substrate motherboard set according to panel quality parameters of second substrates of the combination of second substrate motherboard sets and panel quality parameters of first substrates of the received first substrate motherboard set, and determining the combination of second substrate motherboard sets which is best matched with the received first substrate motherboard set according to all determined first matching rates and second matching rates.

DETAILED DESCRIPTION

Figure 1:
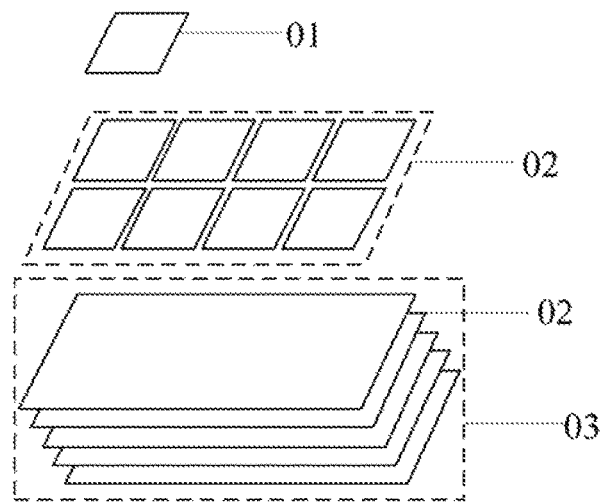
FIG. 1 is a schematic view illustrating a relationship between a first substrate, a first substrate mother board, and a first substrate motherboard set in the present disclosure.

The present disclosure will be described in detail below in conjunction with the drawings and embodiments, thus objects, features and advantages of the present disclosure described above will become easier to understand. However, example embodiments can be implemented in a variety of forms and should not be construed as being limited to the forms set forth herein. Instead, these example embodiments are provided such that the present disclosure becomes more comprehensive and complete, and the concept of the example embodiments can be fully conveyed to those skilled in the art. A same reference numeral in the drawings indicates a same or similar structure, and repeated description thereof will be omitted. The terms indicating position and orientation in the present disclosure are described with examples in the drawings, and modifications may be made as needed, and the modifications are included in the scope of the present disclosure.

It should be noted that specific details of embodiments are described in the following description for ease of fully understanding of the present disclosure. However, the present disclosure can be implemented in a variety of other ways different from those described herein, and those skilled in the art can make similar expansions without departing from the scope of the present disclosure. The present disclosure is therefore not limited by the specific embodiments disclosed below. When a term is used in the specification and claims to indicate a particular component, those skilled in the art should understand that different hardware manufacturers may indicate the same component by using different words. Differences of components in function instead of in name are used in the present specification and claims for distinguishing the components. The word "comprising/including" used throughout the specification and claims is an open term and should be interpreted as "including but not limited to". The description below presents exemplary embodiments of the present disclosure, which is intended to illustrate the general principles of the present disclosure, and is not intended to limit the scope of the present disclosure. The protection scope of the present disclosure is defined by the appended claims.

In the current matching technology, motherboards without defective substrates in an array substrate motherboard set and a color film substrate motherboard set are directly put into a subsequent process without a matching operation, and array substrate motherboards and color film substrate motherboards having defective substrates need to be pretreated before matched by using Hungary matching algorithm. During the pretreatment, array substrate motherboards and color film substrate motherboards are sorted according to the number of defective substrates therein.

For example, a color film substrate motherboard set may be taken as a benchmark, and an array substrate motherboard set best matched with the color film substrate motherboard set is determined from a collection including a plurality of array substrate motherboard sets in a waiting pool (WIP). Then, a plurality of array substrate motherboards included in the array substrate motherboard set best matched with the color film substrate motherboard set are arranged, by a matching apparatus, in an order of a plurality of color film substrate motherboards included in the color film substrate motherboard set, such that each of the plurality of array substrate motherboards included in the array substrate motherboard set are matched with respective one of the plurality of color film substrate motherboards included in the color film substrate motherboard set. The above solution may maximize a matching speed between the array substrate motherboard set and the color film substrate motherboard set in a case that the array substrate motherboard set is produced in a same speed as the color film substrate motherboard set; and in a case that the array substrate motherboard set is produced in a different speed as the color film substrate motherboard set, the matching operation between the array substrate motherboard set and the color film substrate motherboard set cannot always be performed in time due to their mutual waiting, which causes that the matching apparatus is idle at times and results in a waste of resources. Even if the matching operation between the array substrate motherboard set and the color film substrate motherboard set can be performed in time, the array substrate motherboard set which is best matched with the color film substrate motherboard set may not be found since the number of array substrate motherboard sets in the waiting pool is not enough. In addition, in a case that the matching apparatus is idle at times, the matching apparatus is configured to perform not only the matching operation but also a merging operation. For example, in order to reduce part-loaded holders, substrate motherboards of a same type in two part-loaded holders are merged into one of the two part-loaded holders, thus the other one is freed. However, if the merging operation takes a long time, the matching apparatus may not be able to perform the matching operation between the array substrate motherboard set and the color film substrate motherboard set in time.

The present disclosure provides a method and device for manufacturing a display apparatus to skip the pretreatment of a first substrate motherboard set and a second substrate motherboard set in the matching operation before assembling first substrates with second substrates, such that a matching speed between the first substrate motherboard set and the second substrate motherboard set is maximized.

It should be noted that, in embodiments of the present disclosure, the first substrate motherboard set is placed in a first clamping structure, the first substrate motherboard set includes a plurality of first substrate motherboards, and the first substrate motherboard includes a plurality of first substrates; and the second substrate motherboard set is placed in a second clamping structure, the second substrate motherboard set includes a plurality of second substrate motherboards, and the second substrate motherboard includes a plurality of second substrates. The first substrate may be the color film substrate, and the second substrate may be the array substrate. The first substrate motherboard, which has not been assembled with the second substrate motherboard and has not been cut to form display panels, is a collection of the first substrates, and the second substrate motherboard is, which has not been assembled with the first substrate motherboard and has not been cut to form display panels, a collection of the second substrates. In this case, the first substrate motherboard is the color film substrate motherboard and the first substrate motherboard set is the color film substrate motherboard set, and the second substrate motherboard is the array substrate motherboard and the second substrate motherboard set is the array substrate motherboard set. Alternatively, the first substrate motherboard may be the array substrate mother board and the first substrate motherboard set may be the array substrate motherboard set, and the second substrate motherboard may be the color film substrate motherboard and the second substrate motherboard set may be the color film substrate motherboard set.

In order to more clearly explain a relationship among the first substrate motherboard set, the first substrate motherboard, and the first substrate in the present disclosure, the relationship is schematically shown in FIG. 1. As shown in FIG. 1, the first substrate motherboard 02 includes a plurality of first substrate 01 arranged in an array, in other words, the first substrate motherboard 02 is a single structure and includes a plurality of first substrates 01 which are arranged in an array and have not been cut. The first substrate motherboard set 03 includes a plurality of first substrate mother boards 02. The first substrate may be the color film substrate or the array substrate, and alternatively, the first substrate may be a display panel or a touch substrate.

A method for manufacturing a display apparatus provided in the present disclosure will be described below in conjunction with the drawings.

Figure 2:
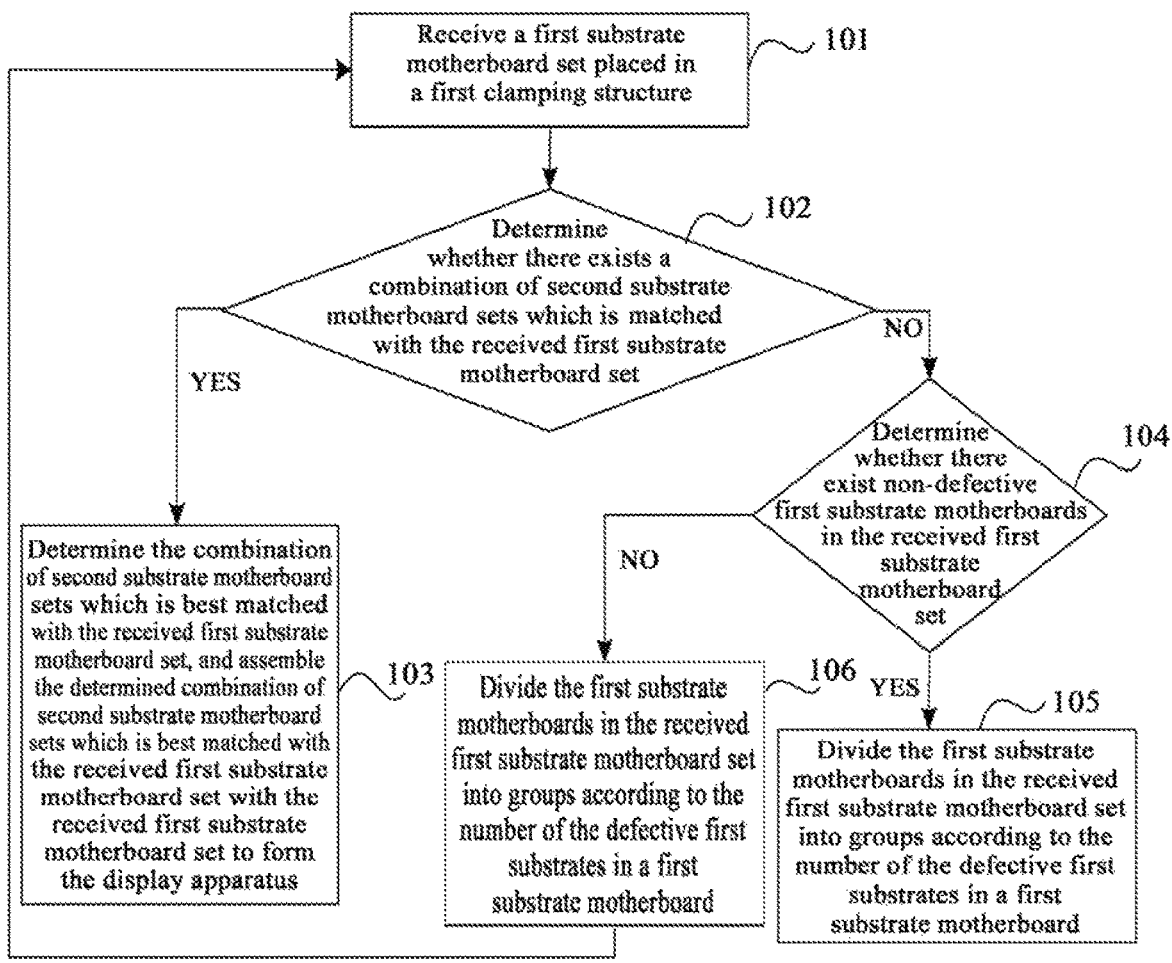
FIG. 2 is a schematic flowchart of a method for manufacturing a display device according to an embodiment of the present disclosure.

As shown in FIG. 2, a method for manufacturing a display apparatus according to an embodiment of the present disclosure includes the following steps.

At step 101, the first substrate motherboard set placed in the first clamping structure is received, and the first substrate motherboard set includes a plurality of first substrate motherboards.

At step 102, Whether a combination of second substrate motherboard sets which is best matched with the received first substrate motherboard set (hereinafter, the combination of second substrate motherboard sets which is best matched with the received first substrate motherboard set may also be called a best matched combination or a best matched combination of second substrate motherboard sets) exists in a collection including a plurality of second substrate motherboard sets placed in a plurality of second clamping structures in the waiting pool is determined. If the determination result is YES, the method goes to step 103; and if the determination result is NO, the method goes to step 104.

Specifically, in some embodiments, different combinations of second substrate motherboard sets are formed from a plurality of second substrate motherboard sets in the waiting pool by using Cartesian product, and a first matching rate between each combination of second substrate motherboard sets and the received first substrate motherboard set is calculated. It should be noted that each of the combinations of second substrate motherboard sets may include part or all second substrate motherboard sets of the plurality of second substrate motherboard sets. Then, whether a first matching rate greater than or equal to a predetermined initial threshold of a first matching rate exits in all the calculated first matching rates is determined. If the determination result is YES, there exists the best matched combination of second substrate motherboard sets. In some embodiments, the initial threshold of the first matching rate may be zero.

At Step 103, the combination of second substrate motherboard sets which is best matched with the received first substrate motherboard set is determined, and the determined best matched combination of second substrate motherboard sets is assembled with the received first substrate motherboard set to form the display apparatus.

Specifically, the determining the combination of second substrate motherboard sets which is best matched with the received first substrate motherboard set includes: the first matching rate and a second matching rate between each combination of second substrate motherboard sets and the received first substrate motherboard set are determined according to panel quality parameters of second substrates of the combination of second substrate motherboard sets and panel quality parameters of first substrates of the received first substrate motherboard set, and the combination of second substrate motherboard sets which is best matched with the received first substrate motherboard set is determined according to all the determined first matching rates and second matching rates.

Specifically, in embodiments of present disclosure, the panel quality parameter includes "defective" and "non-defective", that is, the first substrate and the second substrate may be defective first substrates and defective second substrates or non-defective first substrates and non-defective second substrates according to panel quality parameter. The first clamping structure and the second clamping structure are both components having a clamping function, such as a holder. A shape of the first clamping structure may be same with or different from that of the second clamping structure. The number of the first substrate motherboard placed in the first clamping structure in a case that the first clamping structure is fully loaded may be equal to or different from the number of the second substrate motherboard placed in the second clamping structure in a case that the second clamping structure is fully loaded.

The assembling the determined best matched combination of second substrate motherboard sets with the received first substrate motherboard set includes: adjusting an order of a plurality of second substrates of the determined combination of second substrate motherboard sets which is best matched with the received first substrate motherboard set as corresponding to an order of a plurality of first substrates of the received first substrate motherboard set to complete the assembling.

Figure 3:
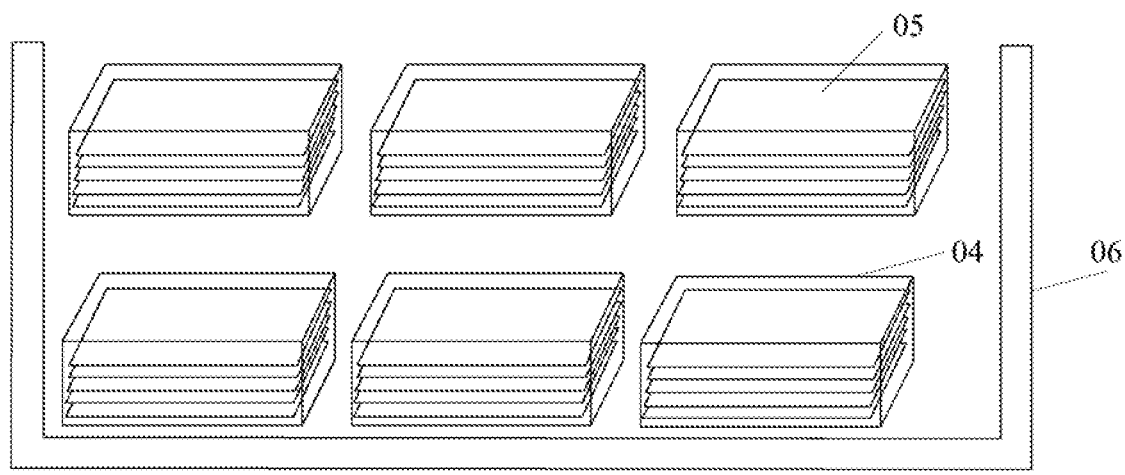
FIG. 3 is a schematic view illustrating a relationship between a waiting pool and second clamping structures in the present disclosure.

The relationship between the second clamping structure, the second substrate motherboard set and the waiting pool will be further explained below. As shown in FIG. 3, the waiting pool 06 includes a plurality of second clamping structures 04, each of the second clamping structures 04 is provided with a plurality of second substrate motherboards 05, and the plurality of second substrate motherboards 05 placed in each of the second clamping structures 04 form one second substrate motherboard set. The second clamping structures 04 as shown in FIG. 3 may be any structures having a clamping function, such as a holder.

It should be noted that in order to enable the steps 102 and 103 to be performed, the following conditions must be satisfied: the number of the first substrate motherboards of the received first substrate motherboard set is equal to the number of the second substrate motherboards of the combination of second substrate motherboard sets which is best matched with the received first substrate motherboard set. Specifically, if the first clamping structure is identical to the second clamping structure, that is, the number of the first substrate motherboards placed in the first clamping structure when the first clamping structure is fully loaded is equal to the number of the second substrate motherboards placed in the second clamping structure when the second clamping structure is fully loaded, and in the process of manufacturing the display apparatus, the first clamping structure and the second clamping structures are both fully loaded, then a combination of second substrate motherboard sets in the present disclosure include only one second substrate motherboard set including a plurality of second substrate motherboards placed in one second clamping structure. Alternatively, if the first clamping structure is identical to the second clamping structure, and in the process of manufacturing the display apparatus, the first clamping structure is fully loaded and the second clamping structures are part-loaded, then a combination of second substrate motherboard sets in the present disclosure include at least two second substrate motherboard sets including a plurality of second substrate motherboards placed in at least two second clamping structures, and the number of the second substrate motherboards placed in the at least two second clamping structures is equal to the number of the first substrate motherboards placed in the first clamping structure. Alternatively, if the first clamping structure is different from the second clamping structure, and the number of the first substrate motherboards placed in the first clamping structure when the first clamping structure is fully loaded is greater than the number of the second substrate motherboards placed in the second clamping structure when the second clamping structure is fully loaded, and in the process of manufacturing the display apparatus, the first clamping structure and the second clamping structures are both fully loaded, then a combination of second substrate motherboard sets in the present disclosure include at least two second substrate motherboard sets including a plurality of second substrate motherboards placed in at least two second clamping structures, and the number of the second substrate motherboards placed in the at least two second clamping structures is equal to the number of the first substrate motherboards placed in the first clamping structure.

For example, in embodiments of the present disclosure, in a case that the number of the first substrate motherboards placed in the first clamping structure when the first clamping structure is fully loaded is twice the number of the second substrate motherboards placed in the second clamping structure when the second clamping structure is fully loaded, if the first clamping structure is half loaded and the second clamping structures are fully loaded, then a combination of second substrate motherboard sets include only one second substrate motherboard set of one second clamping structure. For example, if 20 first substrate motherboards are placed in the first holder as the first clamping structure when the first holder is half loaded and 20 second substrate motherboards are placed in the second holder as the second clamping structure when the second holder is fully loaded, then a combination of second substrate motherboard sets include only 20 second substrate motherboards placed in one second holder.

At step 104, whether a non-defective first substrate motherboard exists in the received first substrate motherboard set is determined. If the determination result is YES, the method goes to step 105; if the determination result is NO, the method goes to step 106.

Specifically, if each of the first substrates in a first substrate motherboard is a non-defective first substrate, the first substrate motherboard is a non-defective first substrate motherboard; and if a first substrate motherboard includes a defective first substrate, the first substrate motherboard is a defective first substrate motherboard.

At step 105, non-defective first substrate motherboards are determined and the determined non-defective first substrate motherboards are assembled with a same number of non-defective second substrate motherboards in the second clamping structure to form the display apparatus.

At step 106, first substrate motherboards in the received first substrate motherboard set are divided into groups according to the number of defective first substrates in a first substrate motherboard, then the method returns to step 101.

Specifically, first substrate motherboards in which the number of the defective first substrates exceeds a preset value are directly discarded. First substrate motherboards in which the number of the defective first substrates is within the preset value are replaced in the first clamping structure to be matched with the combinations of second substrate motherboard sets in the second clamping structures again.

In the method for manufacturing a display apparatus provided by the embodiments of the present disclosure, after receiving the first substrate motherboard set in the first clamping structure, the next step is determining the combination of second substrate motherboard sets which is best matched with the received first substrate motherboard set in the waiting pool, and then assembling the determined best matched combination of second substrate motherboard sets with the received first substrate motherboard set to form the display apparatus. Therefore, the method for manufacturing a display apparatus provided by the present disclosure omits the pretreatment for the first substrate motherboard set in the related art and avoids that the second substrate motherboard set is always in a state of waiting for matching and occupies the second clamping structure. Thus, the matching speed is increased.

Figure 4:
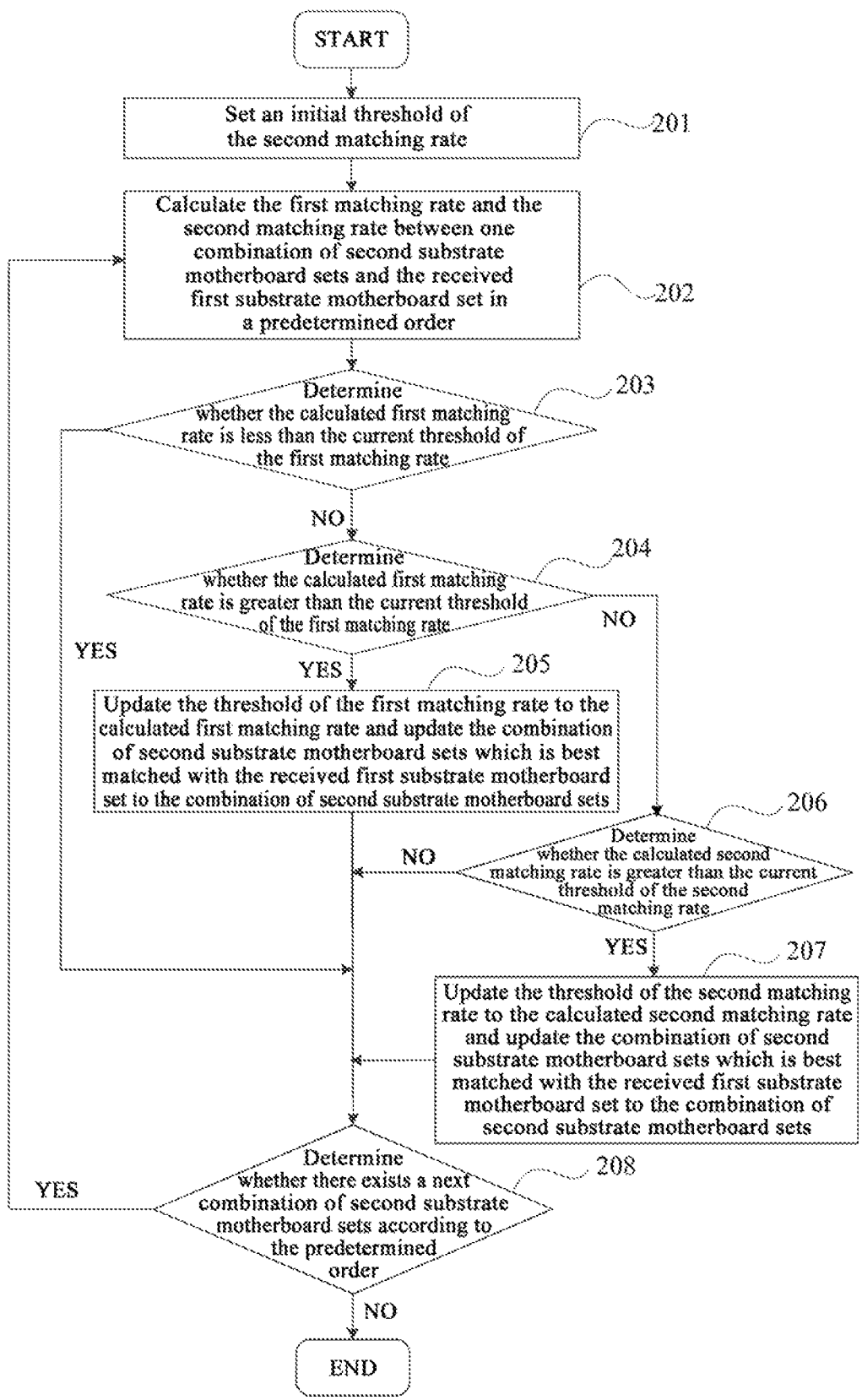
FIG. 4 is a schematic flowchart of details of step 102 in FIG. 3.

In the method for manufacturing a display apparatus provided by the embodiments of the present disclosure, the process in step 103 that the first matching rate and the second matching rate between each combination of second substrate motherboard sets and the received first substrate motherboard set are determined according to panel quality parameters of second substrates of the combination of second substrate motherboard sets and panel quality parameters of first substrates of the received first substrate motherboard set, and the combination of second substrate motherboard sets which is best matched with the received first substrate motherboard set is determined according to all the determined first matching rates and second matching rates, as shown in FIG. 4, includes the following steps.

At step 201, an initial threshold of the second matching rate is set. For example, the initial threshold of the second matching rate may be 0.

At step 202, the first matching rate and the second matching rate between a combination of second substrate motherboard sets and the received first substrate motherboard set are calculated in a predetermined order. The first matching rate and the second matching rate are calculated according to panel quality parameters of second substrates of the combination of second substrate motherboard sets and panel quality parameters of first substrates of the received first substrate motherboard set.

At step 203, whether the calculated first matching rate between the combination of second substrate motherboard sets and the received first substrate motherboard set is less than the current threshold of the first matching rate is determined. If the determination result is YES, the process goes to step 208; and if the determination result is NO, the process goes to step 204.

At step 204, whether the calculated first matching rate between the combination of second substrate motherboard sets and the received first substrate motherboard set is greater than the current threshold of the first matching rate is determined. If the determination result is YES, the process goes to step 205; and if the determination result is NO, the process goes to step 206.

At step 205, the threshold of the first matching rate is updated to the calculated first matching rate between the combination of second substrate motherboard sets and the received first substrate motherboard set, and the combination of second substrate motherboard sets which is best matched with the received first substrate motherboard set is updated to the combination of second substrate motherboard sets.

At step 206, whether the calculated second matching rate between the combination of second substrate motherboard sets and the received first substrate motherboard set is greater than the current threshold of the second matching rate is determined. If the determination result is YES, the process goes to step 207; and if the determination result is NO, the process goes to step 208.

At step 207, the threshold of the second matching rate is updated to the calculated second matching rate between the combination of second substrate motherboard sets and the received first substrate motherboard set, and the combination of second substrate motherboard sets which is best matched with the received first substrate motherboard set is updated to the combination of second substrate motherboard sets.

At step 208, whether a next combination of second substrate motherboard sets exists according to the predetermined order is determined. If the determination result is YES, the process returns to step 202; and if the determination result is NO, the process ends.

Therefore, in the process of determining the combination of second substrate motherboard sets which is best matched with the received first substrate motherboard set, the first matching rate and the second matching rate between each combination of second substrate motherboard sets and the received first substrate motherboard set are calculated, the calculated first matching rates and second matching rates are compared respectively with the current threshold of the first matching rate and the current threshold of the second matching rate, and then a combination of second substrate motherboard sets, of which the first matching rate is the maximum among all the calculated first matching rates and is not less than the initial threshold of the first matching rate, is determined as the combination of second substrate motherboard sets which is best matched with the received first substrate motherboard set. In some embodiments, a combination of second substrate motherboard sets, of which the first matching rate is the maximum among all the calculated first matching rates and is not less than the initial threshold of the first matching rate and the second matching rate is the maximum among all the calculated second matching rates, can be determined as the combination of second substrate motherboard sets which is best matched with the received first substrate motherboard set.

It should be noted that each combination of second substrate motherboard sets in steps 102 and 202 may satisfy the following two conditions.

A first condition is that the number of the second substrate motherboards of the combination of second substrate motherboard sets is equal to the number of the first substrate motherboards of the received first substrate motherboard set.

A second condition is that the number of the defective second substrates of the combination of second substrate motherboard sets is greater than or equal to the number of the defective first substrates of the received first substrate motherboard set.

Specifically, before calculating the first matching rate and the second matching rate between the combination of second substrate motherboard sets and the received first substrate motherboard set, the combination of second substrate motherboard sets needs to satisfy the first condition and the second condition. The first condition ensures that exactly one second substrate motherboard corresponds to each of the first substrate motherboards of the received first substrate motherboard set. The second condition ensures that each of non-defective second substrates of the determined combination of second substrate motherboard sets which is best matched with the received first substrate motherboard set can be assembled with a non-defective first substrates of the received first substrate motherboard set to form a display apparatus. For example, in some embodiments, the number of the defective second substrates of the combination of second substrate motherboard sets is equal to the number of the defective first substrates of the received first substrate motherboard set, thus the combination of second substrate motherboard sets can be assembled with the received first substrate motherboard set, and each defective first substrate of the received first substrate motherboard set correspond to respect one of defective second substrates of the combination of second substrate motherboard sets. Thus non-defective first substrates of the received first substrate motherboard set and non-defective second substrates of the combination of second substrate motherboard sets are effectively utilized. In some embodiments, combinations of second substrate motherboard sets in the waiting pool are more effectively utilized, and combinations of second substrate motherboard sets may be avoided from being in a waiting state. For example, the number of the defective second substrates of the combination of second substrate motherboard sets is greater than the number of the defective first substrates of the received first substrate motherboard set, and then each of non-defective second substrates of the combination of second substrate motherboard sets is assembled with a non-defective first substrate. Thus, based on the first condition and the second condition, each of the first substrate motherboards of the received first substrate motherboard set and each of the second substrate motherboards of the combination of second substrate motherboard sets are effectively utilized, and the first clamping structure and the second clamping structures are effectively utilized.

In the above method for manufacturing a display apparatus provided by the present disclosure, the first matching rate between the combination of second substrate motherboard sets and the received first substrate motherboard set is calculated by using the following Equation (1):

$$P = 1 - \frac{C_N * A_0}{n_1} 100\% \quad (1)$$

the second matching rate between the combination of second substrate motherboard sets and the received first substrate motherboard set is calculated by using the following Equation (2):

$$Q = \frac{C_N * A_N + C_0 * A_0}{n_1} 100\% \quad (2)$$

wherein P is the first matching rate, Q is the second matching rate, $n_1$ is the number of the first substrates of the received first substrate motherboard set, $C_N$ is the number of the defective first substrates of the received first substrate motherboard set, $C_0$ is the number of the non-defective first substrates of the received first substrate motherboard set, $A_N$ is the number of the defective second substrates of the combination of second substrate motherboard sets, $A_0$ is the number of the non-defective second substrates of the combination of second substrate motherboard sets.

The first matching rate and the second matching rate between each combination of second substrate motherboard sets and the received first substrate motherboard set are calculated according to the Equation (1) and Equation (2), and a combination of second substrate motherboard sets, of which the first matching rate is the maximum among all the calculated first matching rates and is not less than the initial threshold of the first matching rate, is determined as the combination of second substrate motherboard sets which is best matched with the received first substrate motherboard set. In some embodiments, a combination of second substrate motherboard sets, of which the first matching rate is the maximum among all the calculated first matching rates and is not less than the initial threshold of the first matching rate and the second matching rate is the maximum among all the calculated second matching rates, is determined as the combination of second substrate motherboard sets which is best matched with the received first substrate motherboard set.

In some embodiments, the first substrate motherboard is the color film substrate motherboard, the second substrate motherboard is the array substrate motherboard, color film substrate motherboards are placed in the first clamping structure, and array substrate motherboards are placed in the second clamping structure. For example, the first clamping structure for placing color film substrate motherboards may place 40 color film substrate motherboards when the first clamping structure is fully loaded, and each of the second clamping structures for placing array substrate motherboards may place 20 array substrate motherboards when the second clamping structure is fully loaded. Accordingly, a combination of array substrate motherboard sets for performing a matching operation with the color film substrate motherboard set in the first clamping structure includes array substrate motherboards placed in two second clamping structures. In some embodiments, the first substrate motherboard is the display panel motherboard and the second substrate motherboard is the touch substrate motherboard. In some embodiments, the first substrate motherboard is the touch substrate motherboard and the second substrate motherboard is the display panel motherboard. The above embodiments are not intended to limit the scope of the present disclosure, and the concept of the present disclosure can be used for a matching operation for assembling between any two substrates.

The method for manufacturing a display apparatus in the present disclosure will be described below in detail by taking the first substrate motherboard being the color film substrate motherboard and the second substrate motherboard being the array substrate motherboard as an example.

Figure 5:
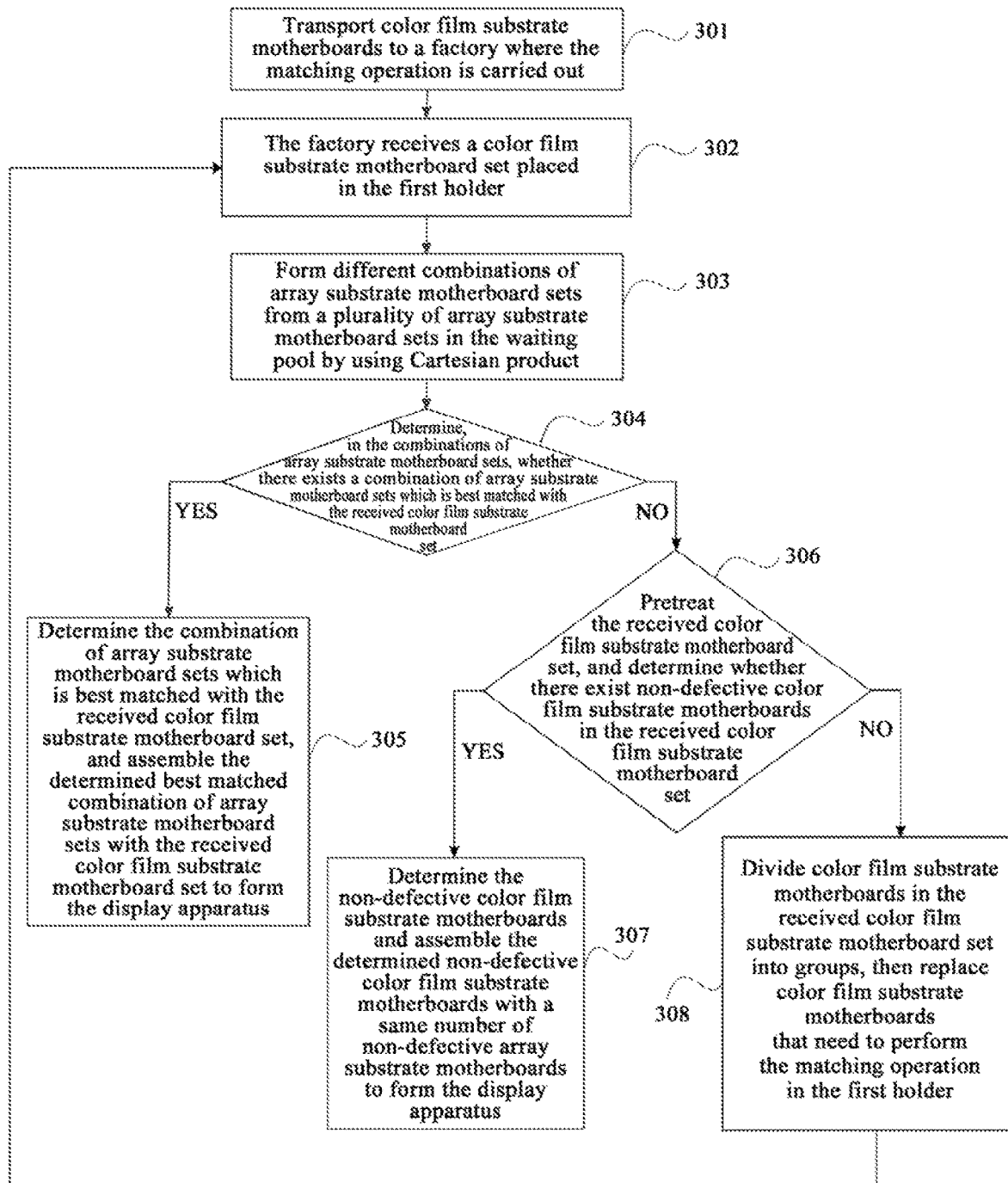
FIG. 5 is a schematic flowchart of details of another method for manufacturing a display device according to an embodiment of the present disclosure.

As shown in FIG. 5, the method for manufacturing a display apparatus provided by the present disclosure includes the following steps.

At step 301, color film substrate motherboards are transported to a factory where the matching operation is carried out.

At step 302, the factory receives a color film substrate motherboard set including a plurality of color film substrate motherboards placed in the first holder.

At step 303, different combinations of array substrate motherboard sets are formed from a plurality of array substrate motherboard sets in the waiting pool by using Cartesian product.

At step 304, whether a combination of array substrate motherboard sets which is best matched with the received color film substrate motherboard set exists in the combinations of array substrate motherboard sets is determined. If the determination result is YES, the method goes to step 305; and if the determination result is NO, the method goes to step 306.

At step 305, the combination of array substrate motherboard sets which is best matched with the received color film substrate motherboard set is determined, and the determined best matched combination of array substrate motherboard sets is assembled with the received color film substrate motherboard set to form the display apparatus.

At step 306, the received color film substrate motherboard set is pretreated, and whether at least one non-defective color film substrate motherboard exists in the received color film substrate motherboard set is determined. If the determination result is YES, the method goes to step 307; if the determination result is NO, the method goes to step 308.

At step 307, the at least one non-defective color film substrate motherboard is determined and the determined at least one non-defective color film substrate motherboard is assembled with a same number of non-defective array substrate motherboards to form the display apparatus.

At step 308, color film substrate motherboards in the received color film substrate motherboard set are divided into groups, then color film substrate motherboards to matched are replaced in the first holder and await a matching operation with the combinations of array substrate motherboard sets in the second holder again.

In some embodiments, in order to improve the matching speed for the color film substrate motherboard, for the first holder which may be loaded with up to 40 color film substrate motherboards when fully loaded, only 20 color film substrate motherboards may be placed in the first holder. This helps to improve the utilization ratio of the first holder and the second holder, and avoids color film substrate motherboards and array substrate motherboards from always being in a waiting state and thus accumulation of color film substrate motherboards and array substrate motherboards.

Figure 6:
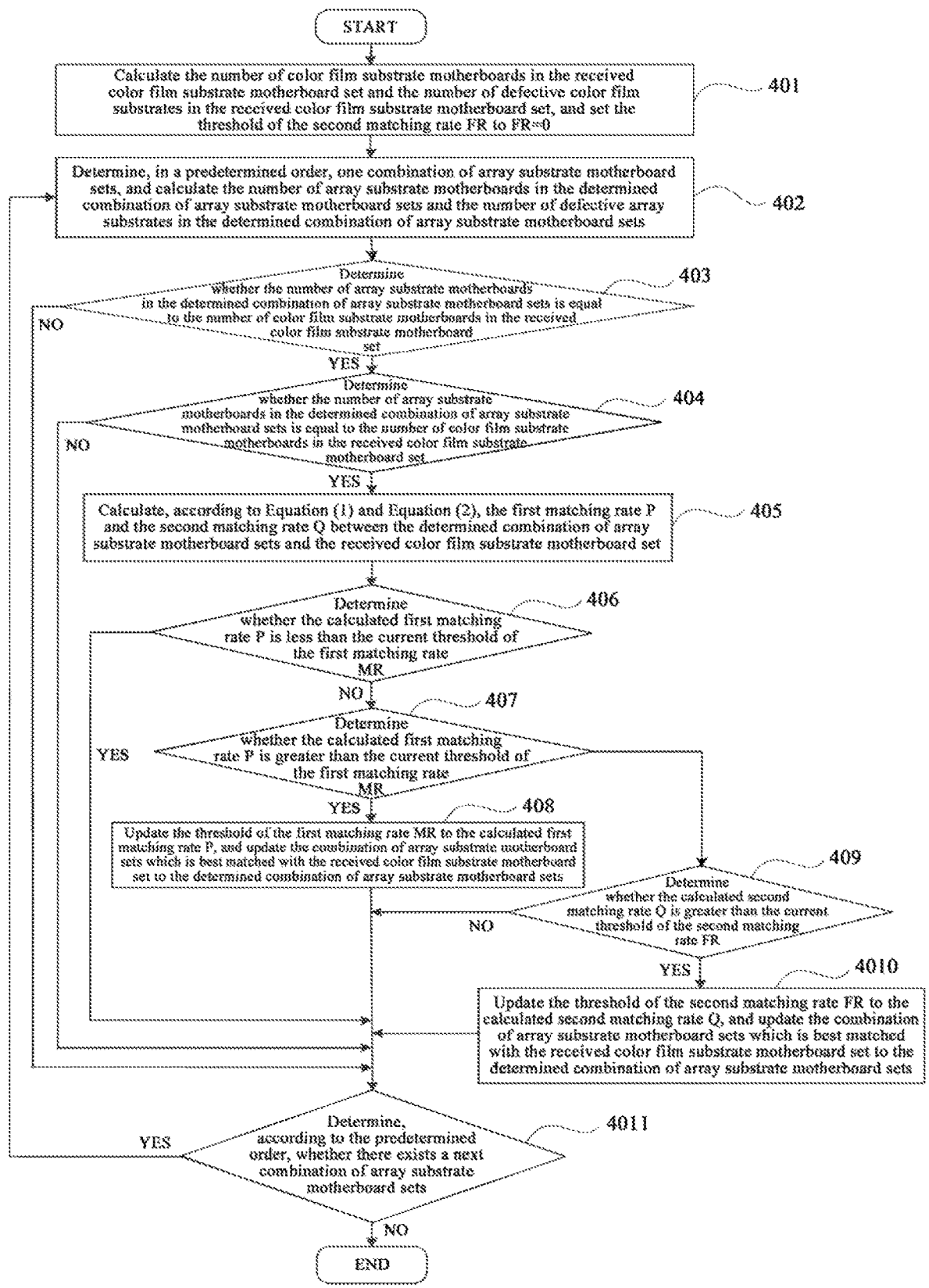
FIG. 6 is a schematic flowchart of details of step 304 in FIG. 5.

In some embodiments, as shown in FIG. 6, the process of determining the combination of array substrate motherboard sets which is best matched with the received color film substrate motherboard set in step 305 includes the following steps.

At step 401, the number of color film substrate motherboards in the received color film substrate motherboard set and the number of defective color film substrates in the received color film substrate motherboard set are both calculated, and the threshold of the second matching rate FR is set to FR=0.

At step 402, a combination of array substrate motherboard sets is determined in a predetermined order, and the number of array substrate motherboards in the determined combination of array substrate motherboard sets and the number of defective array substrates in the determined combination of array substrate motherboard sets are both calculated.

At step 403, whether the number of array substrate motherboards in the determined combination of array substrate motherboard sets is equal to the number of color film substrate motherboards in the received color film substrate motherboard set is determined. If the determination result is YES, the process goes to step 404; if the determination result is NO, the process goes to step 4011.

At step 404, whether the number of defective array substrates in the determined combination of array substrate motherboard sets is greater than the number of defective color film substrates in the received color film substrate motherboard set is determined. If the determination result is YES, the process goes to step 405; if the determination result is NO, the process goes to step 4011.

At step 405, the first matching rate P and the second matching rate Q between the determined combination of array substrate motherboard sets and the received color film substrate motherboard set are calculated according to the above Equation (1) and Equation (2).

At step 406, whether the calculated first matching rate P is less than the current threshold of the first matching rate MR is determined. If the determination result is YES, the process goes to step 4011; and if the determination result is NO, the process goes to step 407.

At step 407, whether the calculated first matching rate P is greater than the current threshold of the first matching rate MR is determined. If the determination result is YES, the process goes to step 408; and if the determination result is NO, the process goes to step 409.

At step 408, the threshold of the first matching rate MR is updated to the calculated first matching rate P, and the combination of array substrate motherboard sets which is best matched with the received color film substrate motherboard set is updated to the determined combination of array substrate motherboard sets.

At step 409, whether the calculated second matching rate Q is greater than the current threshold of the second matching rate FR is determined. If the determination result is YES, the process goes to step 4010; and if the determination result is NO, the process goes to step 4011.

At step 4010, the threshold of the second matching rate FR is updated to the calculated second matching rate Q, and the combination of array substrate motherboard sets which is best matched with the received color film substrate motherboard set is updated to the determined combination of array substrate motherboard sets.

At step 4011, whether a next combination of array substrate motherboard sets exists according to the predetermined order is determined. If the determination result is YES, the process returns to step 402; and if the determination result is NO, the process ends.

Compared with the related art, the method for manufacturing a display apparatus according to embodiments of the present disclosure has the following advantageous effects. When the color film substrate motherboard set is received by the factory, the combination of array substrate motherboard sets which is best matched with the received color film substrate motherboard set is searched automatically in the waiting pool, and the pretreatment mentioned above is skipped. Thus, the matching speed is improved, the accumulation of array substrate motherboard sets in the waiting pool is avoided, and the utilization efficiency of the production equipment is improved. Furthermore, the above first and second conditions ensure that each of the color film substrate motherboards of the received color film substrate motherboard set is assembled with exactly one array substrate motherboard, each of the non-defective array substrates of the combination of array substrate motherboard sets which is best matched with the received color film substrate motherboard set is assembled with a non-defective color film substrate, and the clamping structures are effectively utilized.

Figure 7:
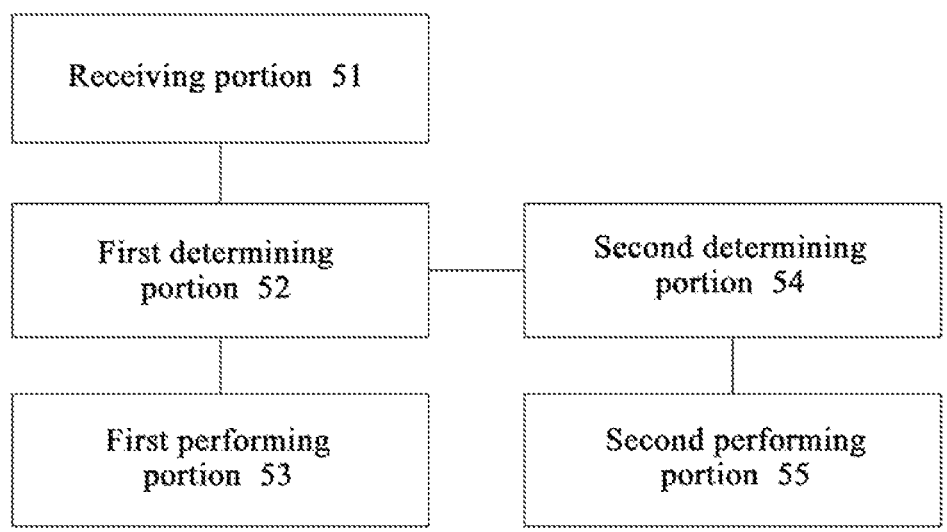
FIG. 7 is a schematic diagram of a structure of a device for manufacturing a display apparatus according to an embodiment of the present disclosure.

As shown in FIG. 7, the present disclosure also provides a device for manufacturing a display apparatus, and the device includes a receiving portion 51, a first determining portion 52 and a first performing portion 53.

The receiving portion 51 is configured to receive a first substrate motherboard set placed in a first clamping structure. The first substrate motherboard set includes a plurality of first substrate motherboards.

The first determining portion 52 is configured to determine, in a collection including a plurality of second substrate motherboard sets placed in a plurality of second clamping structures in the waiting pool, whether there exists a combination of second substrate motherboard sets which is best matched with the received first substrate motherboard set. Further, the first determination portion 52 is also configured to determine, in a case that there exists the combination of second substrate motherboard sets which is best matched with the received first substrate motherboard set, the combination of second substrate motherboard sets which is best matched with the received first substrate motherboard set.

Specifically, the first determination portion 52 is configured to determine the combination of second substrate motherboard sets which is best matched with the received first substrate motherboard set by: determining a first matching rate and a second matching rate between each combination of second substrate motherboard sets and the received first substrate motherboard set according to panel quality parameters of second substrates of the combination of second substrate motherboard sets and panel quality parameters of first substrates of the received first substrate motherboard set, and determining the combination of second substrate motherboard sets which is best matched with the received first substrate motherboard set according to all the determined first matching rates and second matching rates.

The first performing portion 53 is configured to assemble the received first substrate motherboard set with the determined combination of second substrate motherboard sets which is best matched with the received first substrate motherboard set to form the display apparatus.

In the device for manufacturing a display apparatus provided by the present disclosure, the determining a first matching rate and a second matching rate between each combination of second substrate motherboard sets and the received first substrate motherboard set according to panel quality parameters of second substrates of the combination of second substrate motherboard sets and panel quality parameters of first substrates of the received first substrate motherboard set, and the combination of second substrate motherboard sets which is best matched with the received first substrate motherboard set is determined according to all the determined first matching rates and second matching rates, includes the following steps: setting a initial threshold of the second matching rate, for example, the initial threshold of the second matching rate may be 0; calculating the first matching rate and the second matching rate between a combination of second substrate motherboard sets and the received first substrate motherboard set are in a predetermined order, wherein the first matching rate and the second matching rate are calculated according to panel quality parameters of second substrates of the combination of second substrate motherboard sets and panel quality parameters of first substrates of the received first substrate motherboard set; when the calculated first matching rate is greater than the current threshold of the first matching rate, updating the threshold of the first matching rate to the calculated first matching rate, and updating the combination of second substrate motherboard sets which is best matched with the received first substrate motherboard set to the combination of second substrate motherboard sets; and when the calculated first matching rate is equal to the current threshold of the first matching rate and the calculated second matching rate is greater than the current threshold of the second matching rate, updating the threshold of the second matching rate to the calculated second matching rate, and updating the combination of second substrate motherboard sets which is best matched with the received first substrate motherboard set to the combination of second substrate motherboard sets.

Therefore, in the process of determining the combination of second substrate motherboard sets which is best matched with the received first substrate motherboard set, the first matching rate and the second matching rate between each combination of second substrate motherboard sets and the received first substrate motherboard set are calculated, the calculated first matching rates and second matching rates are compared respectively with the current threshold of the first matching rate and the current threshold of the second matching rate. In some embodiments, a combination of second substrate motherboard sets, of which the first matching rate is the maximum among all the calculated first matching rates and is greater than or equal to the initial threshold of the first matching rate, is determined as the combination of second substrate motherboard sets which is best matched with the received first substrate motherboard set, and the threshold of the first matching rate is updated to the calculated first matching rate. In some embodiments, a combination of second substrate motherboard sets, of which the first matching rate is the maximum among all the calculated first matching rates and is greater than or equal to the initial threshold of the first matching rate and the second matching rate is the maximum among all the calculated second matching rates, is determined as the combination of second substrate motherboard sets which is best matched with the received first substrate motherboard set, and the threshold of the second matching rate is updated to the calculated second matching rate.

In the device for manufacturing a display apparatus provided by the present disclosure, each combination of second substrate motherboard sets must satisfy the following conditions: the number of the second substrate motherboards of the combination of second substrate motherboard sets is equal to the number of the first substrate motherboards of the received first substrate motherboard set, and the number of the defective second substrates of the combination of second substrate motherboard sets is greater than or equal to the number of the defective first substrates of the received first substrate motherboard set.

It should be noted that one first substrate motherboard includes a plurality of first substrates and one second substrate motherboard includes a plurality of second substrates.

In the above device for manufacturing a display apparatus provided by the present disclosure, the first matching rate between the combination of second substrate motherboard sets and the received first substrate motherboard set is calculated by using the following Equation (1):

$$P = 1 - \frac{C_N * A_0}{n_1} 100\%$$

the second matching rate between the combination of second substrate motherboard sets and the received first substrate motherboard set is calculated by using the following Equation (2):

$$Q = \frac{C_N * A_N + C_0 * A_0}{n_1} 100\%$$

wherein P is the first matching rate, Q is the second matching rate, $n_1$ is the number of the first substrates of the received first substrate motherboard set, $C_N$ is the number of the defective first substrates of the received first substrate motherboard set, $C_0$ is the number of the non-defective first substrates of the received first substrate motherboard set, $A_N$ is the number of the defective second substrates of the combination of second substrate motherboard sets, $A_0$ is the number of the non-defective second substrates of the combination of second substrate motherboard sets.

The device for manufacturing a display apparatus provided by the present disclosure further includes a second determining portion 54 and a second performing portion 55.

The second determining portion 54 is configured to determine, in a case that there does not exist the combination of second substrate motherboard sets which is best matched with the received first substrate motherboard set, whether there exist non-defective first substrate motherboards in the received first substrate motherboard set.

The second performing portion 55 is configured to determine, in a case that there exist non-defective first substrate motherboards in the received first substrate motherboard set, the non-defective first substrate motherboards, and assemble the determined non-defective first substrate motherboards with a same number of non-defective second substrate motherboards to form the display apparatus, and divide, in a case that there does not exist a non-defective first substrate motherboard in the received first substrate motherboard set, first substrate motherboards in the received first substrate motherboard set into groups according to the number of defective first substrates in a first substrate motherboard to obtain divided first substrate motherboards to be matched with each combination of second substrate motherboard sets again In some embodiments, the first substrate motherboard is the color film substrate motherboard and the second substrate motherboard is the array substrate motherboard.

The present disclosure provides a computer-readable storage medium having stored thereon instructions, when executed by a processor, causing the processor to perform the aforementioned method for manufacturing a display apparatus.

Flowcharts and block diagrams in the drawings illustrates architectures, functions, and operations which can be achieved according to systems, methods, and computer program products of the present disclosure. Each block in a flowchart or block diagram may represent a portion, program segment, or part of code that contains at least one executable instruction for achieving a specified logic function. It should also be noted that in some alternative implementations, the functions noted in the blocks may also occur in an order different from the order shown the drawings. For example, two blocks represented sequentially can actually be executed substantially in parallel, or they can sometimes be executed in the opposite order, depending on functions involved. It should also be noted that each block in the block diagram and/or flowchart, as well as a combination of blocks in the block diagram and/or flowchart, can be achieved through a dedicated hardware-based system that performs a specified function or operation, or can be achieved through a combination of a dedicated hardware and computer instructions.

Portions or components involved in embodiments of the present disclosure may be implemented by software or hardware. The portions or components may also be installed in a processor, for example, the portions may be software programs installed in a computer or mobile intelligent device, or may be hardware devices configured separately. Names of the portions or components should not be interpreted as a limitation to the portions or components.

It should be noted that the above embodiments are only exemplary embodiments used to illustrate the principles of the present disclosure and the disclosure is not limited thereto. Modifications and changes may be made by those skilled in the art without departing from the spirit and essence of the disclosure, and these modifications and changes are also considered to be within the scope of protection of the disclosure.

What is claimed is:

1. A method for manufacturing a display apparatus, comprising:
   receiving a first substrate motherboard set placed in a first clamping structure;
   determining, in a collection comprising a plurality of second substrate motherboard sets placed in a plurality of second clamping structures in a waiting pool, whether there exists a combination of second substrate motherboard sets which is matched with the received first substrate motherboard set;
   determining, in a case that there exists the combination of second substrate motherboard sets which is matched with the received first substrate motherboard set, a combination of second substrate motherboard sets which is best matched with the received first substrate motherboard set, and assembling the determined combination of second substrate motherboard sets which is best matched with the received first substrate motherboard set with the received first substrate motherboard set to form the display apparatus,
   wherein the first substrate motherboard set comprises a plurality of first substrate motherboards and the second substrate motherboard set comprises a plurality of second substrate motherboards;
   the step of determining, in the collection comprising the plurality of second substrate motherboard sets placed in the plurality of second clamping structures in the waiting pool, whether there exists the combination of second substrate motherboard sets which is best matched with the received first substrate motherboard set comprises: forming different combinations of second substrate motherboard sets from the plurality of second substrate motherboard sets in the waiting pool by using Cartesian product, calculating a first matching rate between each combination of second substrate motherboard sets and the received first substrate motherboard set according to panel quality parameters of second substrates of the combination of second substrate motherboard sets and panel quality parameters of first substrates of the received first substrate motherboard set, and determining, in all calculated first matching rates for the different combinations of second substrate motherboard sets, whether there exists a first matching rate greater than or equal to a predetermined initial threshold of the first matching rate to obtain a determination result, and if the determination result is positive, determining that there exists the combination of second substrate motherboard sets which is matched with the received first substrate motherboard set;
   the step of the determining the combination of second substrate motherboard sets which is best matched with the received first substrate motherboard set comprises: determining a second matching rate between each combination of second substrate motherboard sets and the received first substrate motherboard set according to panel quality parameters of second substrates of the combination of second substrate motherboard sets and panel quality parameters of first substrates of the received first substrate motherboard set, and determining the combination of second substrate motherboard sets which is best matched with the received first substrate motherboard set according to all determined first matching rates and second matching rates.

2. The method of claim 1, wherein the step of determining the first matching rate and the second matching rate between each combination of second substrate motherboard sets and the received first substrate motherboard set according to panel quality parameters of second substrates of the combination of second substrate motherboard sets and panel quality parameters of first substrates of the received first substrate motherboard set, and determining the combination of second substrate motherboard sets which is best matched with the received first substrate motherboard set according to all determined first matching rates and second matching rates comprises:
  setting an initial threshold of the second matching rate;
  calculating, according to panel quality parameters of second substrates of a combination of second substrate motherboard sets and panel quality parameters of first substrates of the received first substrate motherboard set, the first matching rate and the second matching rate between the combination of second substrate motherboard sets and the received first substrate motherboard set in a predetermined order;
  updating, in a case that the calculated first matching rate is greater than the current threshold of the first matching rate, the threshold of the first matching rate to the calculated first matching rate and updating the combination of second substrate motherboard sets which is best matched with the received first substrate motherboard set to the combination of second substrate motherboard sets; and
  updating, in a case that the calculated first matching rate is equal to the current threshold of the first matching rate and the calculated second matching rate is greater than the current threshold of the second matching rate, the threshold of the second matching rate to the calculated second matching rate and updating the combination of second substrate motherboard sets which is best matched with the received first substrate motherboard set to the combination of second substrate motherboard sets.

3. The method of claim 2, wherein, the combination of second substrate motherboard sets satisfies conditions that the number of the second substrate motherboards of the combination of second substrate motherboard sets is equal to the number of the first substrate motherboards of the received first substrate motherboard set, and the number of defective second substrates of the combination of second substrate motherboard sets is greater than or equal to the number of defective first substrates of the received first substrate motherboard set; and one first substrate motherboard comprises a plurality of first substrates and one second substrate motherboard comprises a plurality of second substrates.

4. The method of claim 3, wherein the first matching rate between the combination of second substrate motherboard sets and the received first substrate motherboard set is calculated by using the following Equation $$P = 1 - \frac{C_N * A_0}{n_1} 100\%,$$

the second matching rate between the combination of second substrate motherboard sets and the received first substrate motherboard set is calculated by using the following Equation $$Q = \frac{C_N * A_N + C_0 * A_0}{n_1} 100\%,$$

and
P is the first matching rate, Q is the second matching rate, $n_1$ is the number of the first substrates of the received first substrate motherboard set, $C_N$ is the number of the defective first substrates of the received first substrate motherboard set, $C_0$ is the number of non-defective first substrates of the received first substrate motherboard set, $A_N$ is the number of the defective second substrates of the combination of second substrate motherboard sets, $A_0$ is the number of non-defective second substrates of the combination of second substrate motherboard sets.

5. The method of claim 2, wherein the initial threshold of the first matching rate is 0 and the initial threshold of the second matching rate is 0.

6. The method of claim 1, wherein in a case that there does not exist the combination of second substrate motherboard sets which is best matched with the received first substrate motherboard set, the method further comprises:
  determining whether there exists at least one non-defective first substrate motherboard in the received first substrate motherboard set;
  determining, in a case that there exists at least one non-defective first substrate motherboard in the received first substrate motherboard set, the at least one non-defective first substrate motherboard, and assembling the determined at least one non-defective first substrate motherboard with a same number of non-defective second substrate motherboards to form the display apparatus; and
  dividing, in a case that there does not exist a non-defective first substrate motherboard in the received first substrate motherboard set, the first substrate motherboards in the received first substrate motherboard set into groups according to the number of the defective first substrates in the first substrate motherboard to obtain divided first substrate motherboards to be matched with each combination of second substrate motherboard sets again.

7. The method of claim 1, wherein the received first substrate motherboard is a color film substrate motherboard and the second substrate motherboard is an array substrate motherboard.

8. The method of claim 1, wherein the step of assembling the determined combination of second substrate motherboard sets which is best matched with the received first substrate motherboard set with the received first substrate motherboard set comprises: adjusting an order of the plurality of second substrates of the determined combination of second substrate motherboard sets which is best matched with the received first substrate motherboard set as corresponding to an order of the plurality of first substrates of the received first substrate motherboard set to complete the assembling.

9. A device for manufacturing a display apparatus, comprising:
  a receiving portion configured to receive a first substrate motherboard set placed in a first clamping structure;
  a first determining portion configured to determine, in a collection comprising a plurality of second substrate motherboard sets placed in a plurality of second clamping structures in a waiting pool, whether there exists a combination of second substrate motherboard sets which is best matched with the received first substrate motherboard set and determine, in a case that there exists the combination of second substrate motherboard sets which is matched with the received first substrate motherboard set, a combination of second substrate motherboard sets which is best matched with the received first substrate motherboard set; and
  a first performing portion configured to assemble the determined combination of second substrate motherboard sets which is best matched with the received first substrate motherboard set with the received first substrate motherboard set to form the display apparatus, wherein the first substrate motherboard set comprises a plurality of first substrate motherboards and the second substrate motherboard set comprises a plurality of second substrate motherboards;

the first determining portion is further configured to determine, in the collection comprising the plurality of second substrate motherboard sets placed in the plurality of second clamping structures in the waiting pool, whether there exists the combination of second substrate motherboard sets which is matched with the received first substrate motherboard set by: forming different combinations of second substrate motherboard sets from the plurality of second substrate motherboard sets in the waiting pool by using Cartesian product, calculating a first matching rate between each combination of second substrate motherboard sets and the received first substrate motherboard set according to panel quality parameters of second substrates of the combination of second substrate motherboard sets and panel quality parameters of first substrates of the received first substrate motherboard set, and determining, in all calculated first matching rates for the different combinations of second substrate motherboard sets, whether there exists a first matching rate greater than or equal to a predetermined initial threshold of the first matching rate to obtain a determination result, and if the determination result is positive, determining that there exists the combination of second substrate motherboard sets which is matched with the received first substrate motherboard set;

the first performing portion is further configured to determine the combination of second substrate motherboard sets which is best matched with the received first substrate motherboard set by: determining a second matching rate between each combination of second substrate motherboard sets and the received first substrate motherboard set according to panel quality parameters of second substrates of the combination of second substrate motherboard sets and panel quality parameters of first substrates of the received first substrate motherboard set, and determining the combination of second substrate motherboard sets which is best matched with the received first substrate motherboard set according to all determined first matching rates and second matching rates.

10. The device of claim 9, wherein the step of determining the first matching rate and a second matching rate between each combination of second substrate motherboard sets and the received first substrate motherboard set according to panel quality parameters of second substrates of the combination of second substrate motherboard sets and panel quality parameters of first substrates of the received first substrate motherboard set, and determining the combination of second substrate motherboard sets which is best matched with the received first substrate motherboard set according to all the determined first matching rates and second matching rates comprises:

setting an initial threshold of the second matching rate;

calculating, according to panel quality parameters of second substrates of a combination of second substrate motherboard sets and panel quality parameters of first substrates of the received first substrate motherboard set, the first matching rate and the second matching rate between the combination of second substrate motherboard sets and the received first substrate motherboard set in a predetermined order;

updating, in a case that the calculated first matching rate is greater than the current threshold of the first matching rate, the threshold of the first matching rate to the calculated first matching rate and updating the combination of second substrate motherboard sets which is best matched with the received first substrate motherboard set to the combination of second substrate motherboard sets; and updating, in a case that the calculated first matching rate is equal to the current threshold of the first matching rate and the calculated second matching rate is greater than the current threshold of the second matching rate, the threshold of the second matching rate to the calculated second matching rate and updating the combination of second substrate motherboard sets which is best matched with the received first substrate motherboard set to the combination of second substrate motherboard sets.

11. The device of claim 10, wherein, the combination of second substrate motherboard sets satisfies conditions that the number of the second substrate motherboards of the combination of second substrate motherboard sets is equal to the number of the first substrate motherboards of the received first substrate motherboard set, and the number of defective second substrates of the combination of second substrate motherboard sets is greater than or equal to the number of defective first substrates of the received first substrate motherboard set; and one first substrate motherboard comprises a plurality of first substrates and one second substrate motherboard comprises a plurality of second substrates.

12. The device of claim 11, wherein the first matching rate between the combination of second substrate motherboard sets and the received first substrate motherboard set is calculated by using the following Equation $$P = 1 - \frac{C_N * A_0}{n_1} 100\%,$$

the second matching rate between the combination of second substrate motherboard sets and the received first substrate motherboard set is calculated by using the following Equation $$Q = \frac{C_N * A_N + C_0 * A_0}{n_1} 100\%,$$

and

P is the first matching rate, Q is the second matching rate, $n_1$ is the number of the first substrates of the received first substrate motherboard set, $C_N$ is the number of the defective first substrates of the received first substrate motherboard set, $C_0$ is the number of non-defective first substrates of the received first substrate motherboard set, $A_N$ is the number of the defective second substrates of the combination of second substrate motherboard sets, $A_0$ is the number of non-defective second substrates of the combination of second substrate motherboard sets.

13. The device of claim 9, further comprising:

a second determining portion configured to determine, in a case that there does not exist the combination of second substrate motherboard sets which is best matched with the received first substrate motherboard set, whether there exists at least one non-defective first substrate motherboard in the received first substrate motherboard set; and a second performing portion configured to determine, in a case that there exists at least one non-defective first substrate motherboard in the received first substrate motherboard set, the at least one non-defective first substrate motherboard and assemble the determined at least one non-defective first substrate motherboard with a same number of non-defective second substrate motherboards to form the display apparatus, and divide, in a case that there does not exist a non-defective first substrate motherboard in the received first substrate motherboard set, the first substrate motherboards in the received first substrate motherboard set into groups according to the number of the defective first substrates in a first substrate motherboard to obtain divided first substrate motherboards to be matched with each combination of second substrate motherboard sets again.

14. The device of claim 9, wherein the first substrate motherboard is a color film substrate motherboard and the second substrate motherboard is an array substrate motherboard.

15. A non-transitory computer-readable storage medium having stored thereon instructions, when executed by a processor, causing the processor to perform a method for manufacturing a display apparatus, comprising: receiving a first substrate motherboard set placed in a first clamping structure; determining, in a collection comprising a plurality of second substrate motherboard sets placed in a plurality of second clamping structures in a waiting pool, whether there exists a combination of second substrate motherboard sets which is matched with the received first substrate motherboard set; determining, in a case that there exists the combination of second substrate motherboard sets which is matched with the received first substrate motherboard set, the combination of second substrate motherboard sets which is best matched with the received first substrate motherboard set, and assembling the determined combination of second substrate motherboard sets which is best matched with the received first substrate motherboard set with the received first substrate motherboard set to form the display apparatus, wherein the first substrate motherboard set comprises a plurality of first substrate motherboards and the second substrate motherboard set comprises a plurality of second substrate motherboards; the step of determining, in the collection comprising the plurality of second substrate motherboard sets placed in the plurality of second clamping structures in the waiting pool, whether there exists the combination of second substrate motherboard sets which is matched with the received first substrate motherboard set comprises: forming different combinations of second substrate motherboard sets from the plurality of second substrate motherboard sets in the waiting pool by using Cartesian product, calculating a first matching rate between each combination of second substrate motherboard sets and the received first substrate motherboard set according to panel quality parameters of second substrates of the combination of second substrate motherboard sets and panel quality parameters of first substrates of the received first substrate motherboard set, and determining, in all calculated first matching rates for the different combinations of second substrate motherboard sets, whether there exists a first matching rate greater than or equal to a predetermined initial threshold of the first matching rate to obtain a determination result, and if the determination result is positive, determining that there exists the combination of second substrate motherboard sets which is best matched with the received first substrate motherboard set; the step of the determining the combination of second substrate motherboard sets which is best matched with the received first substrate motherboard set comprises: determining the first matching rate and a second matching rate between each combination of second substrate motherboard sets and the received first substrate motherboard set according to panel quality parameters of second substrates of the combination of second substrate motherboard sets and panel quality parameters of first substrates of the received first substrate motherboard set, and determining the combination of second substrate motherboard sets which is best matched with the received first substrate motherboard set according to all determined first matching rates and second matching rates.

* * * * *